(12) United States Patent
Lakshmikumar et al.

(10) Patent No.: US 7,701,301 B2
(45) Date of Patent: Apr. 20, 2010

(54) SYSTEMS FOR IMPLEMENTING A TEMPERATURE AND PROCESS COMPENSATED TWO-STAGE RING OSCILLATOR

(75) Inventors: Kadaba Lakshmikumar, Basking Ridge, NJ (US); Vinod Mukundagiri, Eatontown, NJ (US)

(73) Assignee: Conexant Systems, Inc., Newport Beach, CA (US)

( * ) Notice: Subject to any disclaimer, the term of this patent is extended or adjusted under 35 U.S.C. 154(b) by 62 days.

(21) Appl. No.: 11/853,394

(22) Filed: Sep. 11, 2007

(65) Prior Publication Data

US 2008/0061893 A1    Mar. 13, 2008

Related U.S. Application Data

(60) Provisional application No. 60/844,195, filed on Sep. 13, 2006.

(51) Int. Cl.
*H03K 3/03* (2006.01)
*H03L 1/00* (2006.01)

(52) U.S. Cl. .................. 331/57; 331/176; 331/186
(58) Field of Classification Search ............... 331/57, 331/176, 185, 186
See application file for complete search history.

(56) References Cited

U.S. PATENT DOCUMENTS

| | | | |
|---|---|---|---|
| 5,072,197 A | | 12/1991 | Anderson |
| 5,668,505 A | | 9/1997 | Vu et al. |
| 5,714,911 A | * | 2/1998 | Gilbert ................ 331/57 |
| 6,008,701 A | * | 12/1999 | Gilbert ................ 331/57 |
| 6,084,483 A | * | 7/2000 | Keshtbod ............ 331/57 |

(Continued)

OTHER PUBLICATIONS

Young et al., "A PLL Clock Generator with 5 to 110 MHz of Lock Range for Microprocessors," IEEE Journal of Solid-State Circuits, vol. 27, No. 11, Nov. 1992, pp. 1599-1607.*

(Continued)

*Primary Examiner*—Robert Pascal
*Assistant Examiner*—Levi Gannon
(74) *Attorney, Agent, or Firm*—Thomas, Kayden, Horstememyer & Risley, LLP (57) ABSTRACT

Systems and methods for implementing a temperature compensated two-stage ring oscillator are described. At least one embodiment includes a system for generating a clock signal comprising a self-starting oscillator comprising two delay stages in a ring configuration. The two-stage ring oscillator is configured to generate the clock signal, wherein the delay stages are configured such that the two-stage ring oscillator has a single right-half plane (RHP) pole in each of the two delay stages where feedback is always positive.

For some embodiments, the system further comprises a compensation module configured to sense temperature and process variations and adjust a supply voltage for the two-stage ring oscillator to compensate for temperature and process variations in order to maintain a constant frequency clock signal. For such embodiments, the compensation module comprises a replica circuit configured to mirror operation of the n-channel devices within the two-stage ring oscillator. The compensation module further comprises a constant $g_m$ circuit configured to provide a biasing current to the replica circuit, wherein the replica circuit receives the biasing current to generate a reference voltage. The compensation module further comprises a voltage regulator configured to receive the reference voltage from the replica circuit, wherein the voltage regulator is further configured to provide a supply voltage to the two-stage ring oscillator.

18 Claims, 8 Drawing Sheets

U.S. PATENT DOCUMENTS

| | | | |
|---|---|---|---|
| 6,157,180 | A | 12/2000 | Kuo |
| 6,297,706 | B1 | 10/2001 | Pullela |
| 6,373,341 | B1 | 4/2002 | Morgan |
| 6,597,217 | B2 | 7/2003 | Ingino et al. |
| 6,911,872 | B2 | 6/2005 | Shah et al. |
| 2003/0034849 | A1* | 2/2003 | Sanduleanu .................. 331/58 |
| 2006/0022760 | A1 | 2/2006 | Wu et al. |

OTHER PUBLICATIONS

Alon et al., "Replica Compensated Linear Regulators for Supply-Regulated Phase-Locked Loops," IEEE Journal of Solid-State Circuits, vol. 41, No. 2, Feb. 2006, pp. 413-424.*

Anand, et al. "A CMOS Clock Recovery Circuit for 2.5-Gb/s NRZ Data", IEEE Journal of Solid-State Circuits, vol. 36, No. 3, Mar. 2001 [online], [retrieved on Mar. 13, 2008] Retrieved from the internet: <http://www.ee.ucla.edu/~brweb/papers/Journals/A&RMar01.pdf> pp. 433-434.

Anand, S.B and Razavi, B., "A CMOS Clock Recovery Circuit for 2.5 Gb/s NRZ Data," IEEE Journal of Solid-State Circuits, Mar. 2001, pp. 432-439.

Wilson, W.B. et al., "A CMOS Self-Calibrating Frequency Synthesizer," IEEE Journal of Solid-State Circuits, Oct. 2000, pp. 1437-1444.

Wadhwa, R. et al."A Low-Power 0.13μm CMOS OC-48 SONET and XAUI Complaint SERDES," IEEE Custom Integrated Circuits Conference, Sep. 2003, pp. 577-580.

Ong, et al. ("A 40-43-Gb/s Clock and Data Recovery IC with Integrated SFI-5 1:16 Demultiplexer in SiGe Technology," IEEE J. Solid-State Circuits, vol. 38, pp. 2155-2168, Dec. 2003).

* cited by examiner

SYSTEMS FOR IMPLEMENTING A TEMPERATURE AND PROCESS COMPENSATED TWO-STAGE RING OSCILLATOR

CROSS-REFERENCE TO RELATED APPLICATION

This application claims priority to, and the benefit of, U.S. Provisional Patent Application entitled, "A PROCESS AND TEMPERATURE COMPENSATED TWO-STAGE RING OSCILLATOR," having Ser. No. 60/844,195, filed on Sep. 13, 2006, which is incorporated by reference in its entirety.

TECHNICAL FIELD

The present disclosure generally relates to oscillators, and more particularly, the present disclosure relates to a temperature compensated two-stage ring oscillator.

BACKGROUND

Conventional approaches to generating quadrature clocks generally require at least four delay stages in the ring. A four-stage oscillator runs at approximately half the speed as a two-stage one. As such, one shortcoming to conventional approaches is that in order to increase the speed for a four-stage oscillator, more power must be expended. Conventional approaches to generating quadrature clocks also generally require more area on silicon to implement. One approach to generating quadrature clocks using a two-stage approach is described by Anand ("A CMOS Clock Recovery Circuit for 2.5 Gb/s NRZ data," IEEE Journal of Solid-State Circuits, March 2001, pp. 432-439). Anand teaches a phase-locked clock recovery circuit that operates at 2.5 Gb/s in a 0.4-µm digital CMOS technology. To achieve high speed with low power dissipation, a two-stage ring oscillator is introduced that employs an excess phase shift technique.

However, one shortcoming with this approach is that the circuit has very little gain-margin. Hence, its manufacturability is questionable. Exemplary embodiments of the two-stage ring oscillator described herein address this shortcoming by providing a delay stage with local positive feedback that causes the output to grow exponentially with time. In this respect, embodiments described herein provide for a robust design that is highly manufacturable.

Other conventional approaches to generating clocks seek to set the free running frequency as close as possible to the desired value across all process and temperature variations. One such approach is taught by Wilson, et al. ("A CMOS Self-Calibrating Frequency Synthesizer," IEEE Journal of Solid-State Circuits, Oct. 200, pp. 1437-1444). Wilson, et al. teaches a programmable phase-locked-loop (PLL)-based frequency synthesizer, capable of automatically adjusting the nominal center frequency of the voltage-controlled oscillator (VCO) to an optimum value is described.

Wilson, et al. teaches that in fully integrated PLLs, the VCO output frequency should be tunable over a wide range of frequencies and cover the desired range of the synthesizer output frequencies for all processing variations and operating conditions. A wide tuning range realized by making the VCO gain $K_o$ large has the unwanted effect of increasing the phase noise at the output of the VCO, and hence the PLL as well. Wilson, et al. further teaches that the wide tuning range is realized by digital control, with process variability managed through self-calibration. However, while the approach taught by Wilson, et al. apparently addresses process variations, Wilson, et al. apparently fails to compensate for temperature changes.

A master-slave PLL scheme is proposed by Wadhwa, et al. ("A low-power 0.13 µm CMOS OC-48 SONET and XAUI compliant SERDES," IEEE Custom Integrated Circuits Conference, September 2003, pp. 577-580). Wadhwa, et al. teaches a continuous rate octal 1.0 to 3.2 Gb/s serializer/deserializer circuit that meets SONET and XAUI requirements. Wadhwa et al. teaches that the performance of the SERDES surpasses stringent OC-48 jitter generation and tolerance specifications and teaches that this is achieved with the use of a master-slave PLL tuning scheme and meticulous attention to layout and isolation techniques. Implemented in a 0.13 µm digital CMOS technology, the part exhibits less than 5 mUI r.m.s. jitter and the 1.2 $mm^2$ transceiver dissipates 160 mW. While Wadhwa, et al. appears to address both process and temperature variations continuously, one shortcoming to this approach, however, is that extra area is required by the master PLL.

SUMMARY

Briefly described, one embodiment, among others, includes a system for generating a clock signal comprising a self-starting oscillator comprising two delay stages in a ring configuration. The two-stage ring oscillator is configured to generate the clock signal, wherein the delay stages are configured such that the two-stage ring oscillator has a single right-half plane (RHP) pole in each of the two delay stages where feedback is always positive.

Another embodiment includes a compensation module for maintaining a constant frequency clock signal across temperature and process variations comprising a replica circuit for mirroring operation of n-channel devices within the two-stage ring oscillator, a constant $g_m$ circuit for providing a biasing current to the replica circuit, where the replica circuit receives the biasing current to generate a reference voltage. The embodiment further comprises a voltage regulator for receiving the reference voltage to produce a supply voltage for the oscillator.

Yet another embodiment includes an apparatus for generating a constant frequency clock signal comprising a two-stage ring oscillator comprising two delay stages, wherein the two-stage ring oscillator is configured to generate the constant frequency clock signal, wherein the constant frequency clock signal exhibits a first order linear response as a control voltage varies between a minimum and a maximum, and wherein the two-stage oscillator is configured to have a single right-half plane (RHP) pole in each of the two delay stages.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Having summarized various aspects of the present disclosure, reference will now be made in detail to the description of the disclosure as illustrated in the drawings. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Generally, a very important requirement of ring oscillators is that the free running frequency must be within a certain tolerance level of the desired frequency across all process and temperature spreads. Embodiments of temperature compensated two-stage ring oscillators described herein provide a compact oscillator that may be used in Phase-Locked-Loops (PLLs) for frequency synthesis and for Clock and Data Recovery (CDR) applications where quadrature clocks are often required. While embodiments disclosed herein are provided in the context of PLLs and CDR applications, the disclosed embodiments may be incorporated in essentially any application requiring a stable clock source over temperature and process variations. More specifically, depending on the particular configuration, the oscillator described herein may be implemented in any xDSL modem, central office equipment, a tuner board, a set-top box, a satellite system, a television, a computing device (e.g., laptop, PDA), a cellular telephone, a wireless communication receiver, and/or other devices.

Where jitter requirements can be met, a ring oscillator is generally preferred as it is compact and has a wide tuning range. If a ring oscillator can be built with only two delay stages, it can be utilized to provide quadrature clock phases. However, as appreciated by those skilled in the art, a two-stage ring with strictly a single left-half plane (LHP) pole in each delay stage cannot oscillate. Excess phase shift is required in each delay stage. However, even with the added phase, the gain-margin can be marginal and oscillation is not guaranteed. Therefore, conventional approaches typically incorporate at least four stages to generate quadrature phases. However, it should be noted that this limits the range of oscillation frequencies. Furthermore, four stage implementations take up more area and draw more power.

Exemplary embodiments for a two-stage ring oscillator are described herein which provide oscillations based on having a single right-half plane (RHP) pole in each of the two delay stages. The biasing scheme utilized for exemplary embodiments senses the process corner as well as the temperature variation in order to maintain the center frequency of the oscillator such that it is within ±5% of the desired value. It should be appreciated that the various embodiments do not require any digitally controlled elements such as loading capacitors, and complex digital state machines. Both of these occupy significant area on silicon. Furthermore, conventional approaches utilizing digital tuning methods fail to address fluctuations in the center frequency due to temperature variation. To compensate for temperature variations, a separate compensation scheme generally needs to be added.

Exemplary embodiments described herein incorporate a biasing scheme which compensates for both process and temperature variations. Another shortcoming with digital tuning schemes is that digital tuning schemes must be initiated every time upon power up or upon a system level reset. The time required for the tuning process can be so long such that it affects testing via automated test equipment.

Figure 1A:
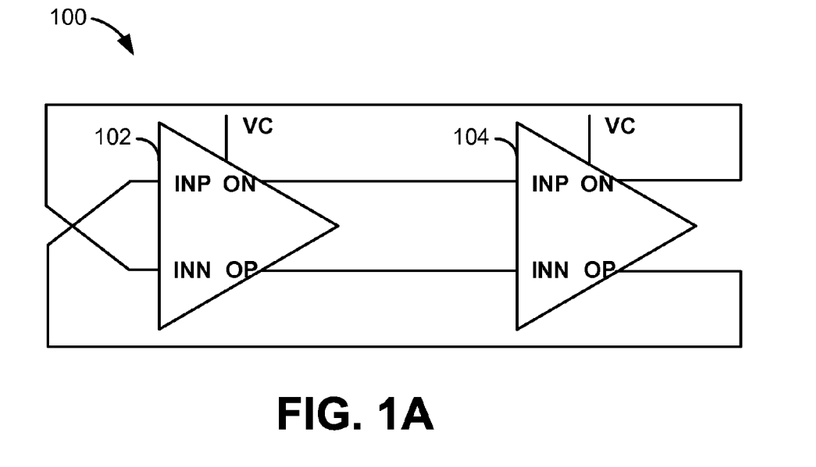
FIG. 1A depicts an exemplary embodiment of a two-stage ring oscillator.
Figure 1B:
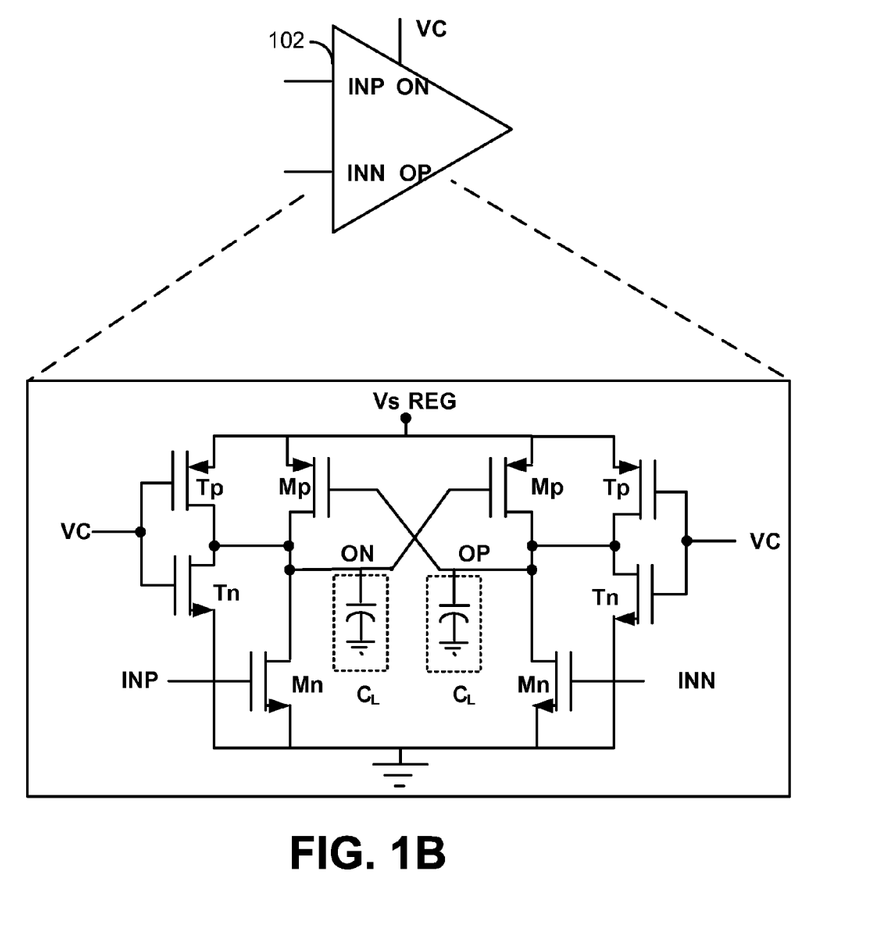
FIG. 1B is an exploded view of one of the delay stages from the two-stage ring oscillator in FIG. 1A.

With reference to the drawings, FIG. 1A depicts an exemplary embodiment of a two-stage ring oscillator. The two-stage ring oscillator is comprised of two delay stages 102, 104. Reference is made to FIG. 1B, which is an exploded view of one of the delay stages from the two-stage ring oscillator in FIG. 1A. The frequency of the oscillator is inversely proportional to the number of delay stages and the delay for each stage, as expressed by the following equation:

$$f = \frac{1}{2N\tau} \quad [1]$$

where f is the frequency of the oscillator, N denotes the number of delay stages, and τ is the delay for each stage. As briefly discussed above, conventional approaches that incorporate four (or more) stages will have lower oscillation frequencies (i.e., a lower ceiling) in addition to experiencing higher power consumption.

The delay elements 102, 104 shown in the ring are cross-coupled latches. The transfer function of a latch is given by:

$$H(s) = \frac{\beta}{(s-\alpha)} \quad [2]$$

The values for pole location α and gain β are given by:

$$\alpha = \frac{(g_{mp}r_0 - 1)}{r_0 C_L} \quad [3]$$

$$\beta = \frac{g_{mn}}{C_L} \quad [4]$$

The parameters $g_{mp}$ and $g_{mn}$ are the transconductance values of MOSFETS Mp and Mn shown in FIG. 1A. Furthermore, $r_0$ depicts the output resistance at nodes OP and ON. The closed loop transfer function of the oscillator is expressed as:

$$H(s) = \frac{\beta^2}{((s-\alpha)^2 + \beta^2)} = \frac{\beta^2}{s^2 - 2\alpha s + \alpha^2 + \beta^2} \quad [5]$$

Furthermore, the response of the oscillator to a unit impulse input is expressed by the following:

$$y(t) = \beta \exp(\alpha \cdot t) \sin(\beta \cdot t) \quad [6]$$

It should be noted that when the value for $\alpha$ is greater than zero (due to local positive feedback in the latch), the amplitude of oscillation exponentially increases with time, thereby illustrating the self-starting nature of the oscillator.

Generally, the amplitude of the oscillations is limited by the voltage supply rails. Furthermore, the angular frequency will be less than $\beta$ because of slewing effects. While Ong, et al. ("A 40-43-Gb/s Clock and Data Recovery IC with Integrated SFI-5 1:16 Demultiplexer in SiGe Technology," IEEE J. Solid-State Circuits, vol. 38, pp. 2155-2168, December 2003) appears to teach a two-stage oscillator including latch type delay elements, Ong, et al. appears to only rely on the parasitic effects in each delay cell in order to generate more than a 90° phase shift for each delay element (to satisfy Barkhausen's criterion).

It should be appreciated that exemplary embodiment of the two-stage ring oscillator shown in FIG. 1A do not rely on any parasitic effects in order to operate. Specifically, the gate-to-drain capacitance ($C_{gd}$) of the FET transistors is not taken into consideration when deriving the transfer function of the latch. It should be noted that if the gate-to drain capacitance $C_{gd}$ is taken into consideration, the latch transfer function will have a zero in the left-hand side of the s-plane that would aid the phase shift caused by the pole in the right-hand side, although, at very high frequencies.

As discussed above, exemplary embodiments of a two-stage ring oscillator are described herein that produce oscillations based on having a single right-half plane (RHP) pole in each of the two delay stages. This is achieved by configuring the two-stage ring oscillator such that the value for $\alpha$ (expressed in Equation 3) is always a positive value. In this regard, the pole of each delay stage within the two-stage ring oscillator is always in the right-half plane and oscillations are always produced. Furthermore, it should be emphasized that no phase shifting devices are required as with conventional approaches.

Alternative embodiments further incorporate a temperature and process compensation scheme to ensure that the oscillation frequency remains constant across temperature and process variations. It should be emphasized, however, that the two-stage ring oscillator always remains operational and is independent of the temperature/process compensation scheme. That is, it should be noted that embodiments of the two-stage ring oscillator described herein reliably generate oscillations with only two delay stages. It should be noted that the temperature/process compensation scheme described herein may be utilized not only with two-stage ring oscillators, but with oscillators in general. Generally, the temperature/process compensation scheme addresses drift in the oscillation frequency and will now be described in detail.

Figure 2:
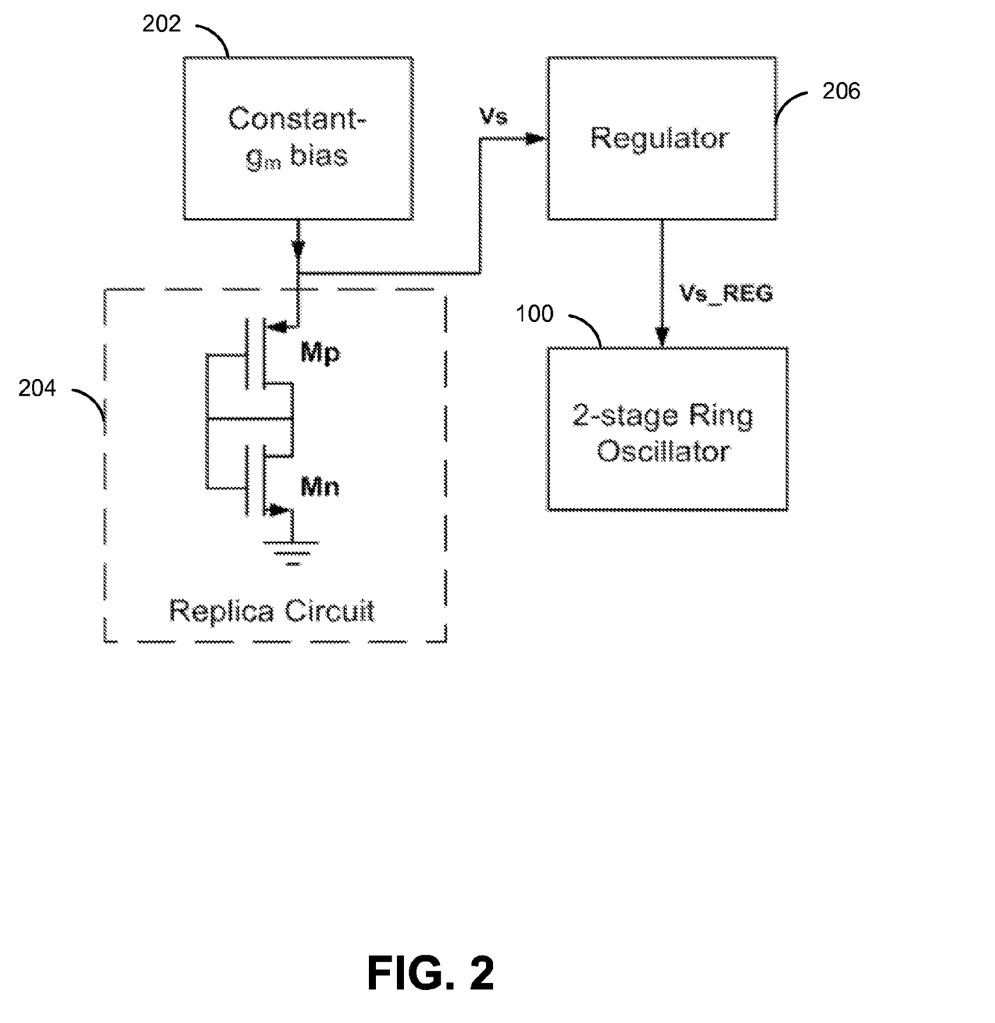
FIG. 2 is a block diagram of a process and temperature compensated oscillator system utilized by the two-stage ring oscillator in FIG. 1A.

FIG. 2 is a block diagram of a process and temperature compensated oscillator system utilized by the two-stage ring oscillator in FIG. 1A. Conventional approaches for tuning of the free running frequency of an oscillator includes digital tuning or master-slave tuning. However, one shortcoming of such approaches is that such approaches fail to provide compact solutions from an implementation standpoint. It should be noted that exemplary embodiments of the two-stage ring oscillator adaptively adjust the operating characteristics of the MOS devices in order to make the center frequency of the oscillator independent of process and temperature variations. As shown in Equation 6, the small signal frequency response is dependent only on the transconductance $g_{mn}$ of MOS transistor Mn for a constant $C_L$. As appreciated by those skilled in the art, the gate oxide thickness is a very tightly controlled process parameter. Accordingly, the parameter $C_L$ can essentially be treated as a constant. As such, embodiments of the two-stage ring oscillator focus on keeping the transconductance parameter ($g_{mn}$) of the n-channel devices within the latch constant over process and temperature variations. In this respect, the center frequency of the oscillator is maintained at a constant value.

As shown in FIG. 2, current from a constant-$g_m$ bias module 202 is applied to the replica circuit 204. The replica circuit 204 is configured to mirror the operating point of the input and feedback devices at the switching instant within the latch in FIG. 1A. For this embodiment, the replica circuit 204 is comprised of two FET transistors Mn and Mp.

The dominant parameters for MOS transistors that are generally affected by process variations are the channel mobility and threshold voltage. Generally, as the temperature increases, the channel mobility decreases. The threshold voltage has a negative temperature coefficient, although the variation is not as pronounced as the mobility. The series connected devices Mn and Mp within the replica circuit 204 generate the reference voltage Vs used by the voltage regulator 206. The voltage regulator 206 ultimately supplies power to the two-stage ring oscillator 100 in FIG. 1A. It should be emphasized that the voltage regulator 206 in the compensation scheme is not considered as overhead (from both a silicon area and power standpoint) as many mixed-signal chips typically utilize a regulator to minimize noise coupling to the oscillator. The locally generated voltage supply VS_REG for the two-stage ring oscillator 100 ensures that the transconductance parameter $g_{mn}$ of the n-channel devices is kept constant across process and temperature variations at the quiescent point of the latch.

Figure 3:
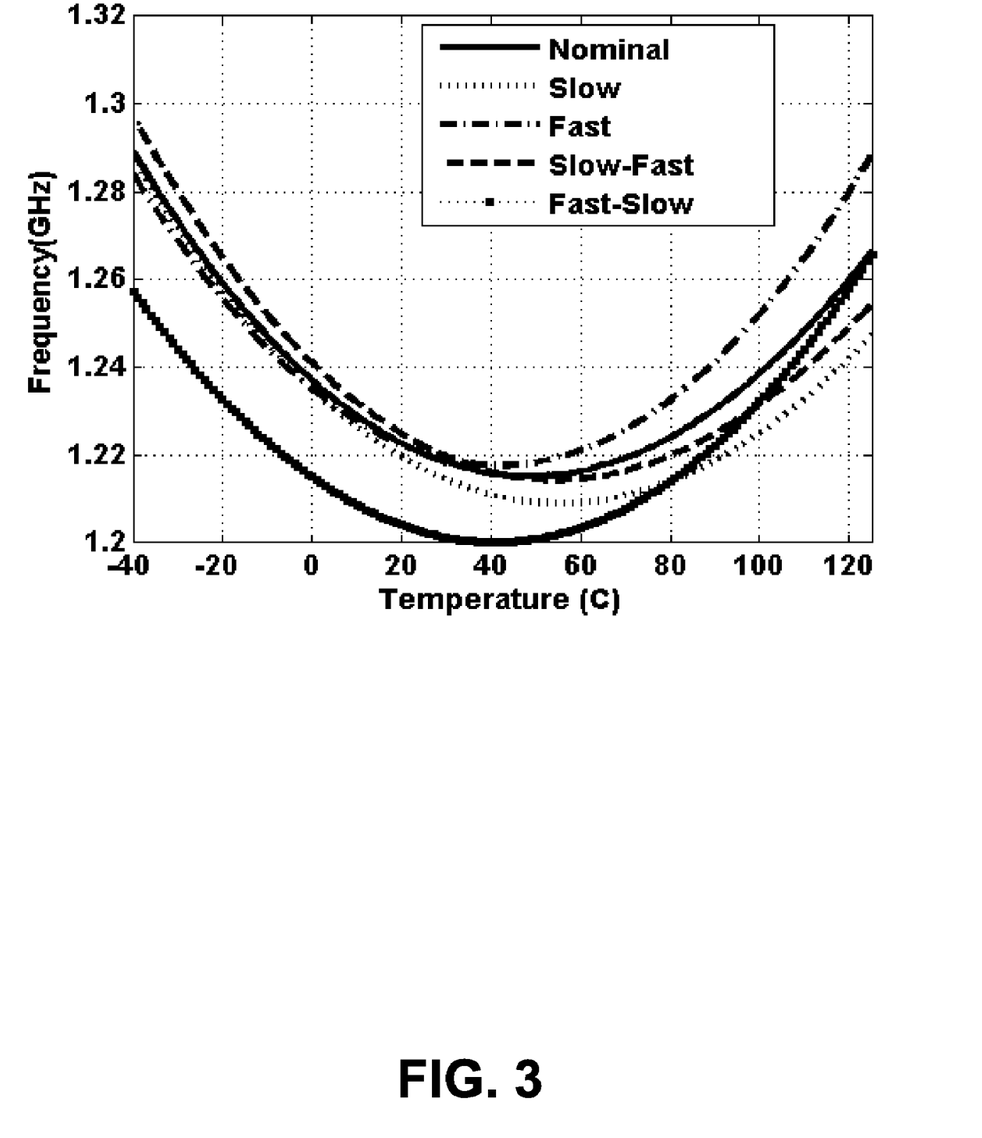
FIG. 3 shows simulation results for an embodiment of the oscillator in FIG. 1A with a nominal frequency of 1.25 GHz over a temperature range of −40 to 125° C. for all five process corners.

Reference is now made to FIG. 3, which shows simulation results for an embodiment of the oscillator in FIG. 1A with a nominal frequency of 1.25 GHz over a temperature range of −40 to 125° C. for five process corners. Process corners generally refer to worst case variations in the production process of MOS transistors. As seen in FIG. 3, the maximum frequency spread across all five process corners and across the entire temperature range (−40° C. to 125° C.) is approximately 100 MHz. It should be noted that this is within ±5% of the nominal value of 1.25 GHz.

Embodiments disclosed herein also provide for linear variation in the frequency as the control voltage experiences variations from rail-to-rail. It should be appreciated that this ensures that the lowest gain will be achieved for any given tuning range, which ultimately minimizes the impact of any noise that couples into the oscillator. Further, it should be appreciated that providing linear variation in the frequency results in a constant bandwidth for the phase-locked loop (PLL) over process, temperature, and operational frequency variations. As known by those skilled in the art, a constant loop bandwidth provides an optimum balance between jitter-transfer and jitter-tolerance characteristics in CDR applications.

Referring back to the exemplary embodiment shown in FIG. 1B, auxiliary currents supplied by tuning devices Tn and Tp alter the transconductance of the n-channel devices Mn within the latch. At moderately low values for the control voltage Vc, tuning device Tp is in saturation mode while tuning device Tn is off, thereby providing excess current to the n-channel input devices Mn. The inverse-function relationship of voltage-to-current and current-to-transconductance ensures a linear increase in frequency as the control voltage decreases. Further, for large control voltages, Tn is conducting while Tp is off, thereby decreasing the currents through the n-channel input devices Mn and lowering their transconductance values and hence lowering the frequency. Again, in this instance, the variation of transconductance and consequently the frequency exhibits first order linear response. From a large signal standpoint, low values of control voltage weaken the latch and therefore, the oscillation frequency increases. Conversely, higher control voltage strengthens the latch and the oscillation frequency decreases.

Figure 4:
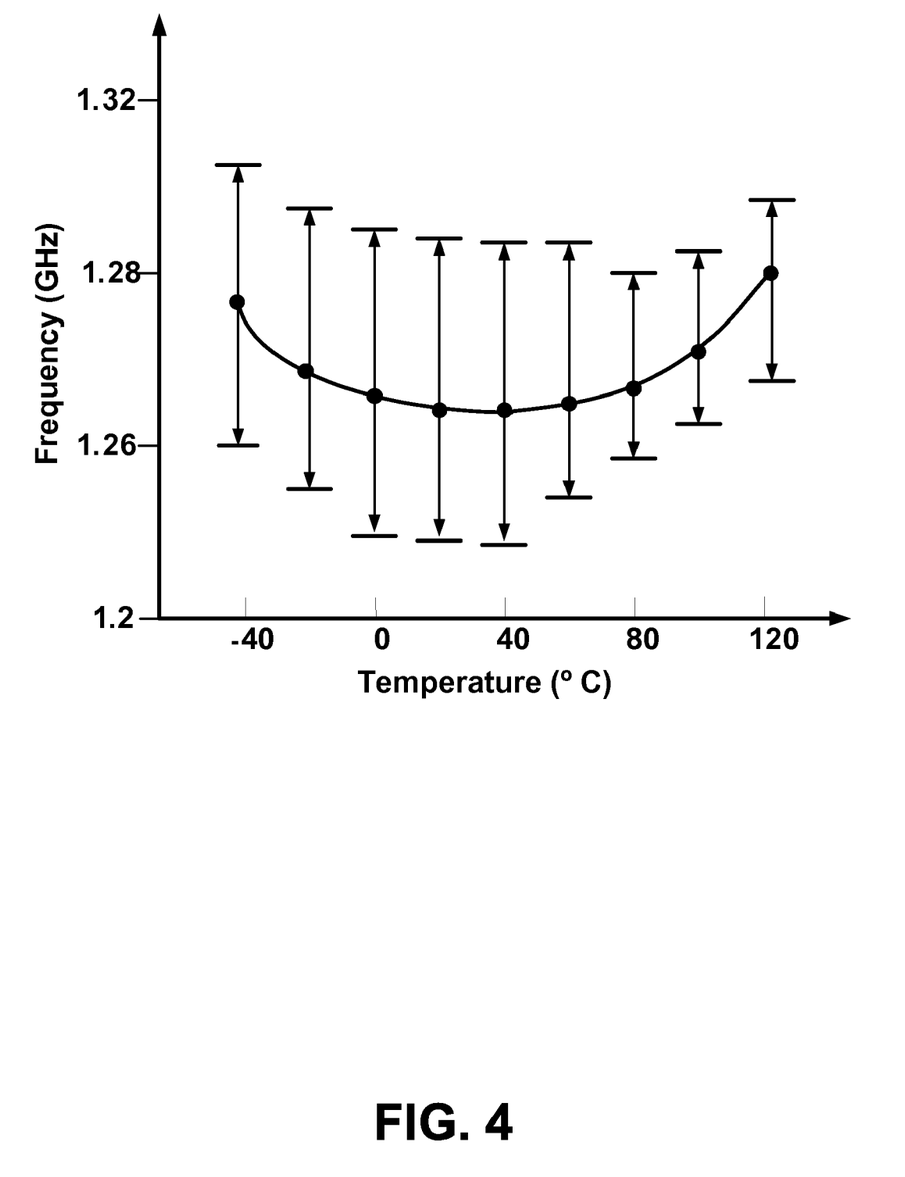
FIG. 4 shows the measured free-running frequency from −40 to 120° C. for an embodiment of the oscillator tested and fabricated in TSMC 0.13 μm process.
Figure 5:
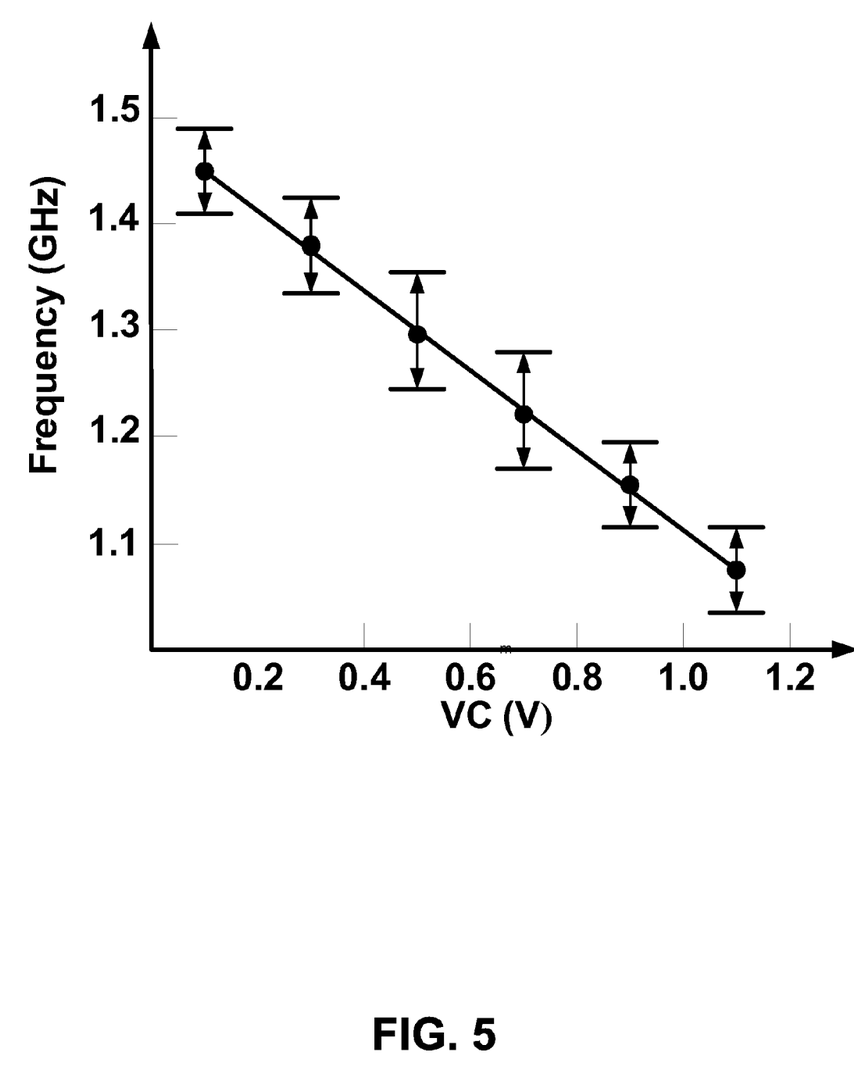
FIG. 5 shows the measured tuning behavior for the embodiment of the oscillator in FIG. 4.

As a non-limiting example, FIG. 4 shows the measured free-running frequency from −40 to 120° C. for an embodiment of the oscillator comprising a classical type-II second order PLL test-chip fabricated in TSMC 0.13 µm process. The error bars show the frequency spread for 15 devices. The measured tuning behavior is shown in FIG. 5. As specified for the embodiments described above, the gain is almost linear across rail-to-rail voltage variations for the control voltage. The oscillator gain has a mean value of 380 MHz/V and a variation of ±50 MHz over a tuning range of 0.1 to 1.1V.

Figure 6:
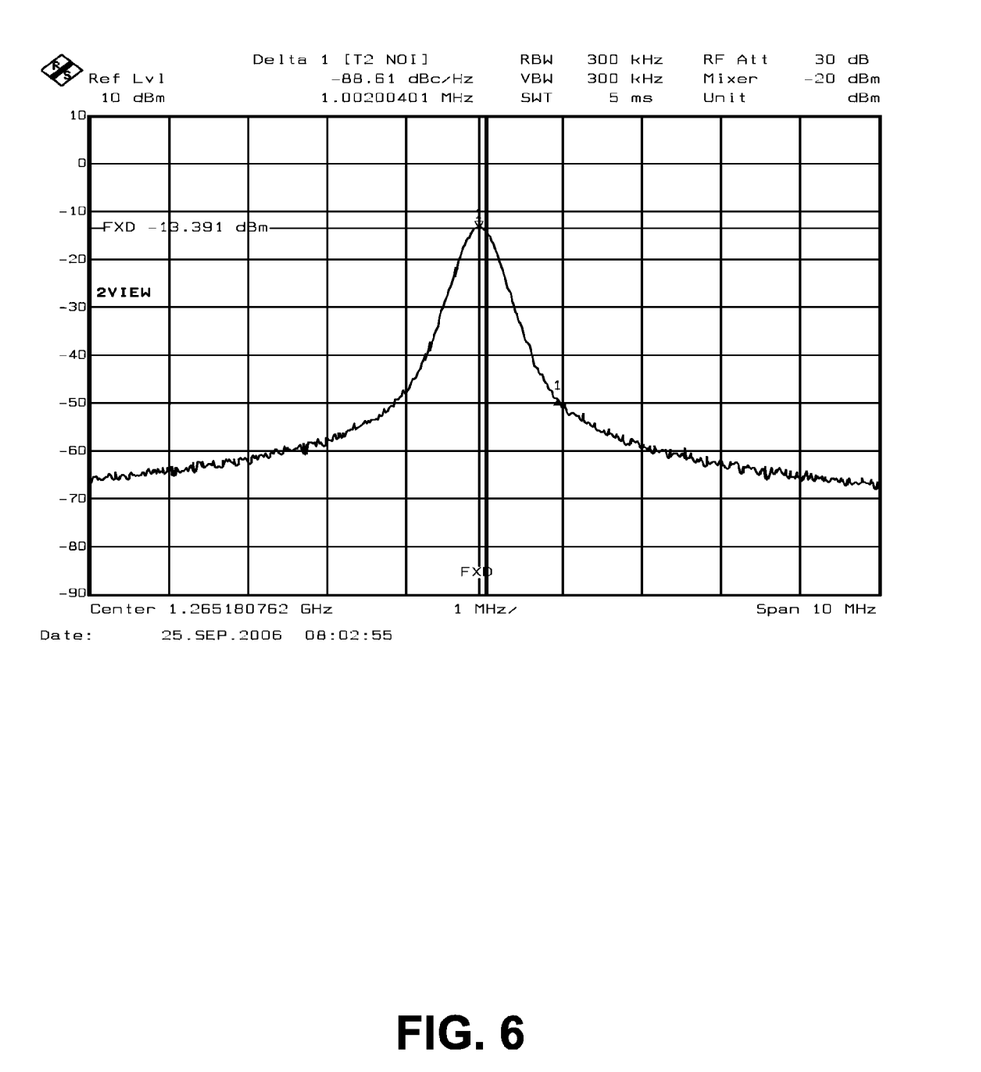
FIG. 6 shows the measured phase-noise of the oscillator in FIG. 4.
Figure 7:
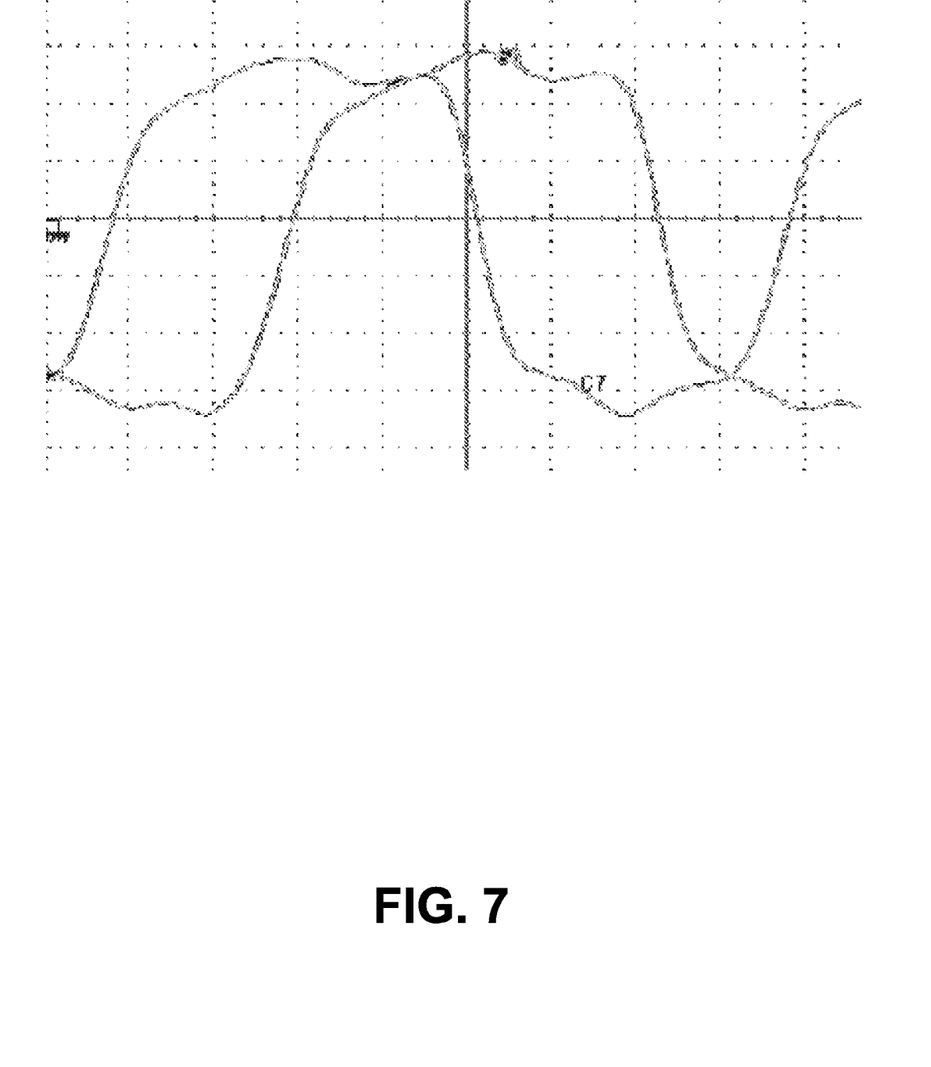
FIG. 7, which shows an oscilloscope trace of the buffered quadrature clocks generated by the oscillator from FIG. 1A.

FIG. 6 shows the measured phase-noise of the oscillator in FIG. 4. Based on FIG. 6, it should be noted that most of the noise is due to the flicker-noise of the transistors in the constant-$g_m$ circuit. In this respect, the phase-noise is not limited by the devices in the delay stages and may be decreased in other embodiments. FIG. 7 shows an oscilloscope trace of the buffered quadrature clocks generated by the oscillator from FIG. 1A.

Figure 8:
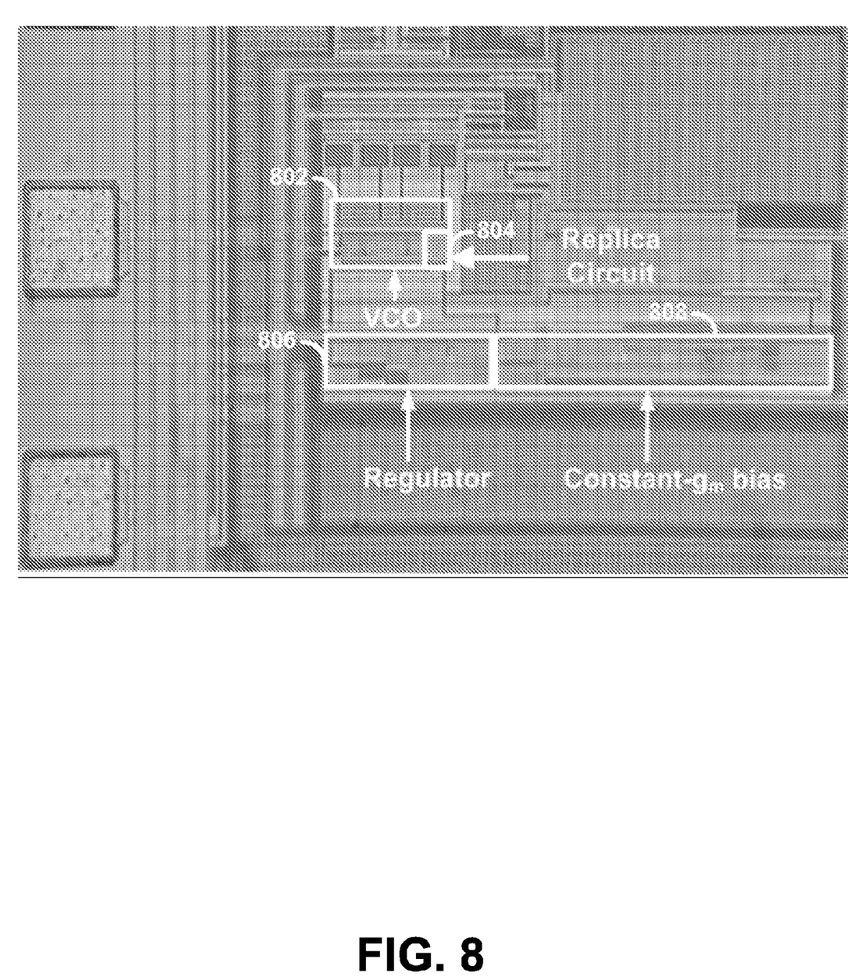
FIG. 8 is a chip photomicrograph of an embodiment of the oscillator in FIG. 1A.

FIG. 8 is a chip photomicrograph of an embodiment of the oscillator in FIG. 1A. As described above, embodiments of the oscillator described herein address certain shortcomings of conventional approaches by providing a compact solution. The voltage controller oscillator 802 shown in FIG. 8 measures 35 µm×80 µm and includes the replica circuit 804. The constant-$g_m$ bias module 808 measures 250 µm×30 µm and the voltage regulator 806 occupies 125 µm×30 µm, including the filter capacitor. It should be appreciated that for the non-limiting example shown in FIG. 8, the constant-$g_m$ bias module 808 and the voltage regulator 806 draw 2.6 mA from a 3.3V supply, and the core oscillator 802 draws 3.4 mA at 25° C.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for generating a clock signal comprising:
  a self-starting oscillator comprising two delay stages in a ring configuration; and
  a compensation module configured to sense temperature and process variations and adjust a supply voltage for the two-stage ring oscillator to compensate for both temperature and process variations in order to maintain a constant frequency clock signal,
  wherein the two-stage ring oscillator is configured to generate the clock signal, and
  wherein the delay stages are configured such that the two-stage ring oscillator has a single right-half plane (RHP) pole in each of the two delay stages where feedback is always positive, and
  wherein the compensation module further comprises:
    a replica circuit configured to mirror operation of the n-channel devices within the two-stage ring oscillator;
    a constant $g_m$ circuit configured to provide a biasing current to the replica circuit, the replica circuit receiving the biasing current to generate a reference voltage; and
    a voltage regulator configured to receive the reference voltage from the replica circuit, the voltage regulator further configured to provide a supply voltage to the two-stage ring oscillator.

2. The system of claim 1, wherein a transfer function H(s) of the two-stage ring oscillator is expressed as:

$$H(s) = \frac{\beta^2}{((s-\alpha)^2 + \beta^2)} = \frac{\beta^2}{s^2 - 2\alpha s + \alpha^2 + \beta^2}$$

where the pole location α is given by:

$$\alpha = \frac{(g_{mp} r_0 - 1)}{r_0 C_L}, \text{ and}$$

gain β is given by:

$$\beta = \frac{g_{mn}}{C_L},$$

wherein $g_{mp}$ and $g_{mn}$ are transconductance values associated with p-channel and n-channel devices within the delay stages, $r_O$ is an output resistance, and $C_L$ is a load capacitance.

3. The system of claim 1, wherein the two delay stages comprise two cross-coupled latches.

4. The system of claim 1, wherein the replica circuit is comprised of two MOSFET transistors.

5. The system of claim 4, wherein the constant gm circuit increases the biasing current provided to the replica circuit when at least one of an increase in temperature and a slow process corner exists, wherein the increase in the biasing current is inversely proportional to a decrease in channel mobility of the MOSFET transistors in the replica circuit, wherein the replica circuit generates an adjusted reference voltage, and wherein the voltage regulator produces an adjusted supply voltage from the adjusted reference voltage, and
  wherein the constant gm circuit decreases the biasing current provided to the replica circuit when at least one of a decrease in temperature and a fast process corner exists, wherein the decrease in the biasing current is inversely proportional to an increase in channel mobility of the MOSFET transistors in the replica circuit, wherein the replica circuit generates an adjusted reference voltage, and wherein the voltage regulator produces an adjusted supply voltage from the adjusted reference voltage.

6. The system of claim 5, wherein the adjusted reference voltage adjusts the transconductance parameter $g_{mn}$ of the n-channel devices within the two-stage ring oscillator to produce the constant frequency clock signal.

7. The system of claim 1, wherein the constant frequency clock signal exhibits a first order linear response as a control voltage within the two-stage ring oscillator varies between a minimum and a maximum.

8. A compensation module for maintaining a constant frequency clock signal across temperature and process variations comprising:
a replica circuit for mirroring operation of n-channel devices within an oscillator;
a constant $g_{mn}$ circuit for providing a biasing current to the replica circuit, the replica circuit receiving the biasing current to generate a reference voltage; and
a voltage regulator for receiving the reference voltage to produce a supply voltage for the oscillator,
wherein the constant gm circuit increases the biasing current provided to the replica circuit when at least one of an increase in temperature and a slow process corner exists.

9. The apparatus of claim 8, wherein the increase in the biasing current is inversely proportional to a decrease in channel mobility of the MOSFET transistors in the replica circuit, wherein the replica circuit generates an adjusted reference voltage, and wherein the voltage regulator produces an adjusted supply voltage from the adjusted reference voltage, and
wherein the constant $g_m$ circuit decreases the biasing current provided to the replica circuit when at least one of a decrease in temperature and a fast process corner exists, wherein the decrease in the biasing current is inversely proportional to an increase in channel mobility of the MOSFET transistors in the replica circuit, wherein the replica circuit generates an adjusted reference voltage, and wherein the voltage regulator produces an adjusted supply voltage from the adjusted reference voltage.

10. The apparatus of claim 9, wherein the biasing circuit is further configured to adjust transconductance parameter $g_{mn}$ of the n-channel devices within the oscillator to produce the constant clock signal.

11. The apparatus of claim 8, wherein the constant frequency clock signal exhibits a first order linear response as a control voltage within the oscillator varies between a minimum and a maximum.

12. The apparatus of claim 8, wherein the apparatus is embodied in at least one of the following: an xDSL modem, central office (CO) equipment, a tuner board, a set-top box, a satellite system, a television, a computing device, a cellular telephone, a phase-locked-loop (PLL), a clock and data recovery (CDR) application, and a wireless communication receiver.

13. An apparatus for generating a constant frequency clock signal comprising:
a two-stage ring oscillator comprising two delay stages, wherein the two-stage ring oscillator is configured to generate the constant frequency clock signal, wherein the constant frequency clock signal exhibits a first order linear response as a control voltage varies between a minimum and a maximum, and wherein the two-stage oscillator is configured to have a single right-half plane (RHP) pole in each of the two delay stages; and
a compensation module configured to sense temperature and process variations and adjust a supply voltage for the two-stage ring oscillator to compensate for the temperature and process variations in order to maintain a constant frequency clock signal, wherein the compensation module further comprises:
a replica circuit configured to mirror operation of n-channel devices within the two-stage ring oscillator;
a constant gm circuit configured to provide a biasing current to the replica circuit, the replica circuit receiving the biasing current to generate a reference voltage; and
a voltage regulator configured to receive the reference voltage from the replica circuit, the voltage regulator further configured to provide a supply voltage to the two-stage ring oscillator.

14. The apparatus of claim 13, wherein the replica circuit is comprised of two MOSFET transistors.

15. The apparatus of claim 14, wherein the constant $g_m$ circuit increases the biasing current provided to the replica circuit when at least one of an increase in temperature and a slow process corner exists, wherein the increase in the biasing current is inversely proportional to a decrease in channel mobility of the MOSFET transistors in the replica circuit, wherein the replica circuit generates an adjusted reference voltage, and wherein the voltage regulator produces an adjusted supply voltage from the adjusted reference voltage, and
wherein the constant gcircuit decreases the biasing current provided to the replica circuit when at least one of a decrease in temperature and a fast process corner exists, wherein the decrease in the biasing current is inversely proportional to an increase in channel mobility of the MOSFET transistors in the replica circuit, wherein the replica circuit generates an adjusted reference voltage, and wherein the voltage regulator produces an adjusted supply voltage from the adjusted reference voltage.

16. The apparatus of claim 15, wherein the adjusted reference voltage adjusts transconductance parameter $g_{mn}$ of the n-channel devices within the two-stage ring oscillator to produce the constant frequency clock signal.

17. The apparatus of claim 13, wherein the apparatus is embodied in at least one of the following: an xDSL modem, central office (CO) equipment, a tuner board, a set-top box, a satellite system, a television, a computing device, a cellular telephone, and a wireless communication receiver.

18. An apparatus comprising:
means for generating a clock signal;
means for monitoring and mirroring operation of the means for generating a clock signal;
means for providing a biasing current to the means for mirroring operation where the means for mirroring operation receives the biasing current to generate a reference voltage; and
means for producing a supply voltage for the means for generating a clock signal based on the reference voltage,
wherein the means for providing a biasing current increases the biasing current provided to the means for mirroring operation when at least one of an increase in temperature and a slow process corner exists.

* * * * *